United States Patent [19]

Okumura et al.

[11] Patent Number: 5,368,062
[45] Date of Patent: Nov. 29, 1994

[54] GAS SUPPLYING SYSTEM AND GAS SUPPLYING APPARATUS

[75] Inventors: Katsuya Okumura, Yokohama; Yoshihisa Sudo, Niiza; Kenichi Goshima, Kasugai; Hiroshi Itafuji, Kasugai; Akihiro Kojima, Kasugai, all of Japan

[73] Assignees: Kabushiki Kaisha Toshiba, Kanagawa; CKD Corporation, Aichi, both of Japan

[21] Appl. No.: 10,325

[22] Filed: Jan. 28, 1993

[30] Foreign Application Priority Data

Jan. 29, 1992 [JP] Japan .................. 4-038589
Jan. 29, 1992 [JP] Japan .................. 4-038590

[51] Int. Cl.5 .............................. F16K 11/20
[52] U.S. Cl. ......................... 137/240; 137/597; 137/624.18
[58] Field of Search ............. 137/240, 597, 606, 15, 137/624.18

[56] References Cited

U.S. PATENT DOCUMENTS

| | | | |
|---|---|---|---|
| 4,064,898 | 12/1977 | Petersen et al. | 137/240 |
| 4,383,547 | 5/1983 | Lorenz et al. | 137/240 |
| 4,572,230 | 2/1986 | Mirabile | 137/240 |
| 4,741,354 | 5/1988 | De Mild | 137/240 |
| 4,917,136 | 4/1990 | Ohmi et al. | 137/240 X |
| 5,137,047 | 8/1992 | George | 137/240 |

*Primary Examiner*—Stephen M. Hepperle
*Attorney, Agent, or Firm*—Finnegan, Henderson, Farabow, Garrett & Dunner

[57] ABSTRACT

A gas supplying system for supplying a corrosive gas or the like to a semiconductor manufacturing apparatus or the like. A plurality of kinds of component gases are introduced into a chamber and mixed therein to form a desired supply gas. After supplying the desired supply gas, the chamber is evacuated and an inert gas is charged into the chamber to substitute a residual supply gas remaining in the chamber by the inert gas. The evacuation of the chamber and the charging of the inert gas into the chamber are repeated two or more times. Accordingly, the residual supply gas can be efficiently removed from the chamber and substituted by the inert gas.

3 Claims, 16 Drawing Sheets

FIG. 1

| STEP / VALVE | 1 | 2 | 3 | 4 | 5 | END |
|---|---|---|---|---|---|---|
| INPUT VALVE | O | C | C | C | (REPETITIONS OF STEPS 3 AND 4) | C |
| OUTPUT VALVE | O | C | C | C | | C |
| EJECTOR | C | C | O | C | | C |
| PURGE VALVE | C | C | C | O | | C |
| | SUPPLY OF STOCK GASES | STOP OF SUPPLY | EVACUATION | PURGING | | STOP OF SYSTEM |

C : CLOSE , O : OPEN

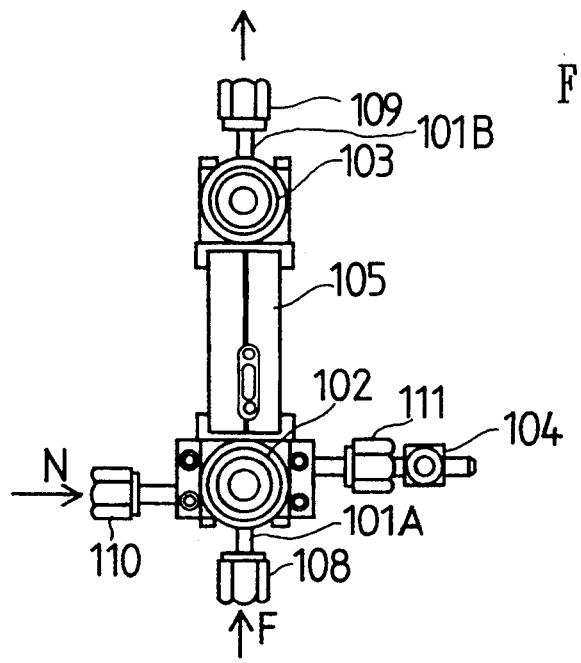
FIG. 11A
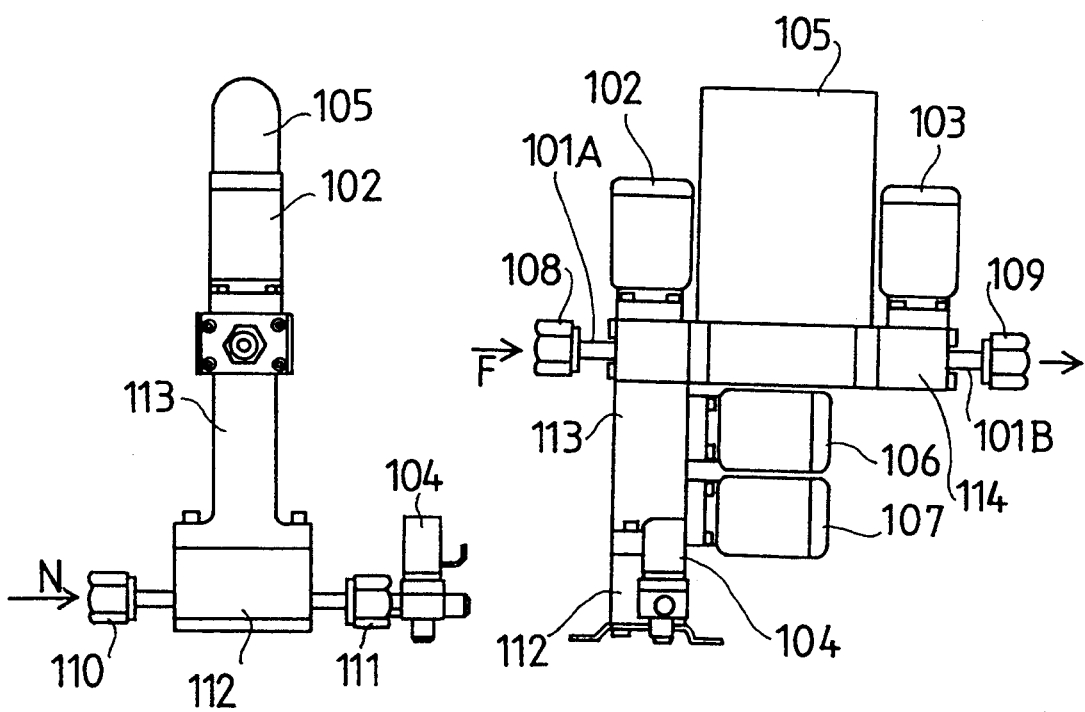
FIG. 11B
FIG. 11C

GAS SUPPLYING SYSTEM AND GAS SUPPLYING APPARATUS

BACKGROUND OF THE INVENTION

1. Field of the Invention

The present invention relates to a gas supplying system and a gas supplying apparatus and, more particularly, to a gas supplying system and a gas supplying apparatus for use with an industrial manufacturing apparatus such as a semiconductor manufacturing apparatus.

2. Description of Related Art

In a semiconductor manufacturing process, a supply gas such as a corrosive gas, toxic gas or combustible gas is conventionally used for etching or the like of photoresist working.

In general, such photoresist working (photoresist coating, exposure, development, and etching) is repeated plural times in the semiconductor manufacturing process, and so, a gas supplying apparatus for supplying a corrosive gas or the like as required is practically used in the semiconductor manufacturing process.

In most cases, a plurality of kinds of supply gases or a supply gas of the same kind having different concentrations are used for the photoresist working.

A desired kind of supply gas is prepared by mixing a plurality of kinds of corrosive gases or component gases in a closed chamber. Further, a desired concentration of supply gas is prepared by mixing an inert gas with a corrosive gas or the like.

Further, it is desired to accurately control an amount of supply gas to be used for etching or the like in response to recent high integration and precision of semiconductors.

Also, the demands regarding a supply timing and a supply speed of the supply gas have become severe in response to the need of shortening of a manufacturing process time.

In a conventional gas supplying apparatus for supplying a corrosive gas or the like, after the corrosive gas is supplied to an etching device or the like, it remains in a gas supply pipe, and is allowed to stand until a fresh corrosive gas is supplied in the next cycle. As a result, an inner wall surface of the gas supply pipe formed of metal is corroded by the residual corrosive gas, and impurities or particles due to the corrosion are mixed into the corrosive gas to be supplied in the next cycle, thus adversely effecting the semiconductors.

Further, in the case of using a chamber or the like for mixing a plurality of kinds of corrosive gases to form a supply gas therein, a residual supply gas even in a small amount remaining in the chamber causes a change in component of a supply gas to be supplied in the next cycle. This may arise a greatly adverse effect on the photoresist working as depending upon the kinds of the residual supply gas and the supply gas to be next supplied, causing a deterioration in quality of semiconductor products.

In the case where the residual supply gas is a combustible gas, there is a possibility that the combustible gas even in a small amount will react with a supply gas to be next supplied to occur combustion or explosion by the combustible gas as depending upon the kind thereof.

Even if the explosion does not occur, a reaction product becomes an impurity as particles to adversely effect the semiconductor manufacturing process.

As measures against the above problems, after mixing desired amounts of plural kinds of corrosive gases together in the chamber to form a desired supply gas and then supplying the desired supply gas to the semiconductor manufacturing process, a residual supply gas remaining in the chamber is substituted by an inert gas such as a nitrogen gas.

The substitution of the residual supply gas by the inert gas is performed by the following known methods.

(1) A method of sucking the residual supply gas remaining in the chamber by using a vacuum pump.

(2) A method of forcibly introducing the inept gas into the chamber to purge the residual supply gas remaining in the chamber.

However, according to the method (1), as the vacuum pump is separate in position from the chamber, the chamber cannot be efficiently evacuated by the vacuum pump. Furthermore, in the case of a corrosive gas, it strongly sticks to the inner wall surfaces of the chamber and the gas supply pipe formed of metal, so that the corrosive gas cannot be perfectly removed.

In general, it is unsuitable to locate the vacuum pump in the vicinity of the gas supplying apparatus from the viewpoints of maintenance and space, and the vacuum pump is therefore located apart from the gas supplying apparatus. As a result, it is necessary to provide a long suction pipe for connecting the chamber to the vacuum pump. Since the suction pipe is long, a suction resistance becomes large to hinder the evacuation of the chamber, so that the residual supply gas remaining in the chamber cannot be perfectly removed.

Furthermore, in the case of a corrosive gas, since the residual corrosive gas to be sucked through the suction pipe by the vacuum pump has a high concentration, the inner wall surface of the suction pipe is corroded by the corrosive gas flowing in the suction pipe.

On the other hand, according to the method (2), much time is required to dilute the residual supply gas. For example, when a nitrogen gas is forced into the chamber under the pressure of 2 kg/cm$^2$, about one hour is required to dilute the residual supply gas down to a concentration of 0.05 ppm which is a reference value less adversely effecting a supply gas to be next supplied. Accordingly, a required period of time for the semiconductor manufacturing process is elongated to reduce a production efficiency.

Incidentally, it is desired to accurately supply a small amount of corrosive gas or the like with an error of 1% or less in terms of a mass flow. Thus, the requirement for a high accuracy has become increasingly severe. To meet this requirement, a flow control valve having a high accuracy and a high responsiveness is used.

In such a flow control valve for accurately controlling a supply amount of a corrosive gas or the like is provided with a mass flow sensor capable of measuring a mass flow with a high accuracy and a high responsiveness. That is, a pair of self-heating temperature sensing elements each having a large temperature coefficient are wound around a thin conduit tube at its upstream and downstream ends to form a pair of heat sensitive coils. A bridge circuit is formed of each heat sensitive coil, and a temperature of each heat sensitive coil is controlled to a constant value. A mass flow of the corrosive gas flowing in the conduit tube is computed from a potential difference between both the bridge circuits.

The conduit tube is formed as a tube having an inner diameter of 0.5 mm and a length of 20 mm, which is made of SUS 316, for example. The small inner diameter is intended to measure a small amount of flowing gas.

Each heat sensitive coil is formed by winding 70 turns of heat sensitive resistance wire having a diameter of 25 μm around the conduit tube. The heat sensitive resistance wire is formed of a material having a large temperature coefficient, such as iron or nickel alloy. Each heat sensitive coil is bonded to the conduit tube by UV curing resin or the like to form a sensing element.

While such a flow control valve is widely used in a corrosive gas supplying apparatus for the semiconductor manufacturing process, it is difficult to perfectly remove the corrosive gas remaining in the thin conduit tube provided in the flow control valve. Further, when an inner wall surface of the conduit tube is corroded by the corrosive gas, the accuracy of the mass flow sensor is reduced. Accordingly, the corrosive gas cannot be supplied with a high accuracy to cause a remarkable decrease in yield in the semiconductor manufacturing process.

SUMMARY OF THE INVENTION

The present invention has been made in view of the above circumstances and has an object to solve the above problems and to provide a gas supplying system and a gas supplying apparatus which can supply a high-purity gas with a high efficiency to a semiconductor manufacturing process or the like.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, there is provided in accordance with a first aspect of the present invention in a gas supplying system employing a plurality of gas input pipes for respectively introducing a plurality of kinds of component gases, a chamber for mixing the component gases introduced from the gas input pipes to form a supply gas, a plurality of gas output pipes for separately discharging the supply gas formed in the chamber, a plurality of first shut-off valves respectively provided in the gas input pipes for shutting off introduction of the component gases into the chamber, a plurality of second shut-off valves respectively provided in the gas output pipes for shutting off discharge of the supply gas from the chamber, means for charging a substitute gas into the chamber after the first and second shut-off valves are closed, and means for evacuating the chamber after the first and second shut-off valves are closed, whereby a substitute gas is substituted for a residual gas remaining in the chamber after supplying the supply gas by the charging means and the evacuating means; the improvement wherein evacuation of the chamber by the evacuating means and charging of the substitute gas by the charging means are repeated two or more times.

In accordance with a second aspect of the present invention, there is provided in a gas supplying apparatus having a plurality of gas input pipes for respectively introducing a plurality of kinds of component gases, a chamber for mixing the component gases introduced from the gas input pipes to form a supply gas, a plurality of gas output pipes for separately discharging the supply gas formed in the chamber, a plurality of first shut-off valves respectively provided in the gas input pipes for shutting off introduction of the component gases into the chamber, a plurality of second shut-off valves respectively provided in the gas output pipes for shutting off discharge of the supply gas from the chamber, means for charging a substitute gas into the chamber after the first and second shut-off valves are closed, and means for evacuating the chamber after the first and second shut-off valves are closed, whereby a substitute gas is substituted for a residual gas remaining in the chamber after supplying the supply gas by the charging means and the evacuating means; the improvement comprising control means for repeating evacuation of the chamber by the evacuating means and charging of the substitute gas by the charging means two or more times.

In accordance with a third aspect of the present invention, there is provided in a gas supplying apparatus having a gas supply pipe for supplying a supply gas, a first shut-off valve provided in the gas supply pipe for shutting off flow of the supply gas, a second shut-off valve provided in the gas supply pipe on a downstream side of the first shut-off valve for shutting off the flow of the supply gas, means connected to the gas supply pipe between the first shut-off valve and the second shut-off valve for charging a substitute gas into the gas supply pipe after the first and second shut-off valves are closed, and means connected to the gas supply pipe between the first shut-off valve and the second shut-off valve for evacuating the gas supply pipe after the first and second shut-off valves are closed, whereby a substitute gas is substituted for a residual gas remaining in the gas supply pipe after supplying the supply gas by the charging means and the evacuating means; the improvement wherein the evacuating means comprises an ejector located in the vicinity of the gas supply pipe, the ejector employing the substitute gas as an operating fluid.

With the construction according to the first and second aspects of the present invention, the plurality of kinds of component gases are introduced from the plurality of gas input pipes into the chamber. In the chamber, the component gases introduced are mixed together to form a desired supply gas. The desired supply gas formed in the chamber is separately discharged from the plurality of gas output pipes.

After the desired supply gas is supplied to a semiconductor manufacturing process or the like, the plurality of first shut-off valves are closed to shut off the introduction of the component gases into the chamber, and the plurality of second shut-off valves are also closed to shut off the discharge of the supply gas from the chamber.

After both the first and second shut-off valves are closed, the chamber is evacuated by the evacuating means, and a substitute gas, i.e., an inert gas such as a nitrogen gas is charged into the chamber by the charging means, thus substituting the substitute gas for a residual gas remaining in the chamber after supplying the supply gas.

In the substituting operation, the evacuation of the chamber by the evacuating means and the charging of the substitute gas into the chamber by the charging means are repeated two or more times.

Accordingly, every time the component gases are introduced into the chamber, the supply gas remaining in the chamber in the previous cycle can be efficiently removed from the chamber, and a desired supply gas can be efficiently supplied to the semiconductor manufacturing process in all cycles.

In the above construction according to the first and second aspects, the plurality of gas output pipes and the plurality of second shut-off valves may be replaced by a single gas output pipe and a single second shut-off valve, respectively.

Further, in the above construction according to the first and second aspects, the plurality of gas input pipes and the plurality of first shut-off valves may be replaced by a single gas input pipe and a single first shut-off valve, respectively. In this case, a supply gas is originally introduced into the chamber, and it is distributed to the plurality of gas output pipes.

According to the third aspect of the present invention, the ejector as the evacuating means is formed as a compact element, so that the gas supplying apparatus can be made compact. Furthermore, the substitute gas is employed as the operating fluid for the ejector. Accordingly, it is not necessary to additionally provide a pipe for supplying the operating fluid from a dedicated supply tank or the like.

The residual supply gas is sucked from the chamber into the ejector under a reduced pressure, and it is mixed with the substitute gas in the ejector. Then, the mixture of the residual supply gas and the substitute gas is discharged from the ejector through a recovery pipe to a recovery tank. That is, a concentration of the residual supply gas is reduced by the substitute gas. Accordingly, even when the supply gas is corrosive gas, the inner wall surfaces of the recovery pipe and the recovery tank is prevented from being corroded by the corrosive gas.

As apparent from the above description according to the first and second aspects of the present invention, the evacuation of the chamber by the evacuating means and the charging of the substitute gas into the chamber by the charging means are repeated two or more times. Accordingly, the residual supply gas in the chamber can be efficiently removed from the chamber and substituted by the substitute gas, so that a supply gas to be supplied in the next cycle is not influenced by the residual supply gas in the chamber in the previous cycle to thereby realize high stability and high efficiency of the semiconductor manufacturing process.

As apparent from the above description according to the third aspect of the present invention, the ejector as the evacuating means is located in the vicinity of the gas supply pipe. Accordingly, the residual supply gas in the gas supply pipe can be efficiently removed and substituted by the substitute gas. Furthermore, since the substitute gas is employed as the operating fluid for the ejector, no additional piping for the operating fluid is required to thereby allow a compact construction of the gas supplying apparatus. In addition, since the residual gas, e.g., a corrosive gas is thinned by the substitute gas, corrosion of the recovery pipe by the corrosive gas can be prevented.

In the construction according to the third aspect, a chamber may be provided in the gas supply pipe between the first shut-off valve and the second shut-off valve. In this case, the charging means is preferably provided on one end of the chamber, and the evacuating means is preferably provided on the other end of the chamber, thereby efficiently removing the residual supply gas from the chamber and substituting the substitute gas for the residual supply gas.

Further, a flow control valve for controlling a mass flow of the supply gas may be provided in the gas supply pipe between the first shut-off valve and the second shut-off valve. In this case, the residual supply gas remaining in a thin conduit tube of a flow sensor formed in the flow control valve can be efficiently removed and substituted by the substitute gas.

The above and further objects and novel features of the invention will become more apparent from the following detailed description when the same is read in connection with the accompanying drawings. It is to be expressly understood, however, that the drawings are for purpose of illustration only and not intended as a definition of the limits of the invention.

BRIEF DESCRIPTION OF THE DRAWINGS

The accompanying drawings, which are incorporated in and constitute a part of this specification, illustrate an embodiment of the invention and, together with the description, serve to explain the objects, advantages and principles of the invention. In the drawings:

FIG. 1 is a schematic illustration of the operation of a gas supplying system in a first preferred embodiment according to the present invention;

FIG. 11A is a top plan view of a gas supplying apparatus applying the gas supplying system shown in FIG. 10;

FIG. 11B is a front elevational view of FIG. 11A;

FIG. 11C is a right side view of FIG. 11A;

DETAILED DESCRIPTION OF THE PREFERRED EMBODIMENTS

A detailed description of one preferred embodiment of a gas supplying system and a gas supplying apparatus embodying the present invention will now be given referring to the accompanying drawings.

Figure 2:
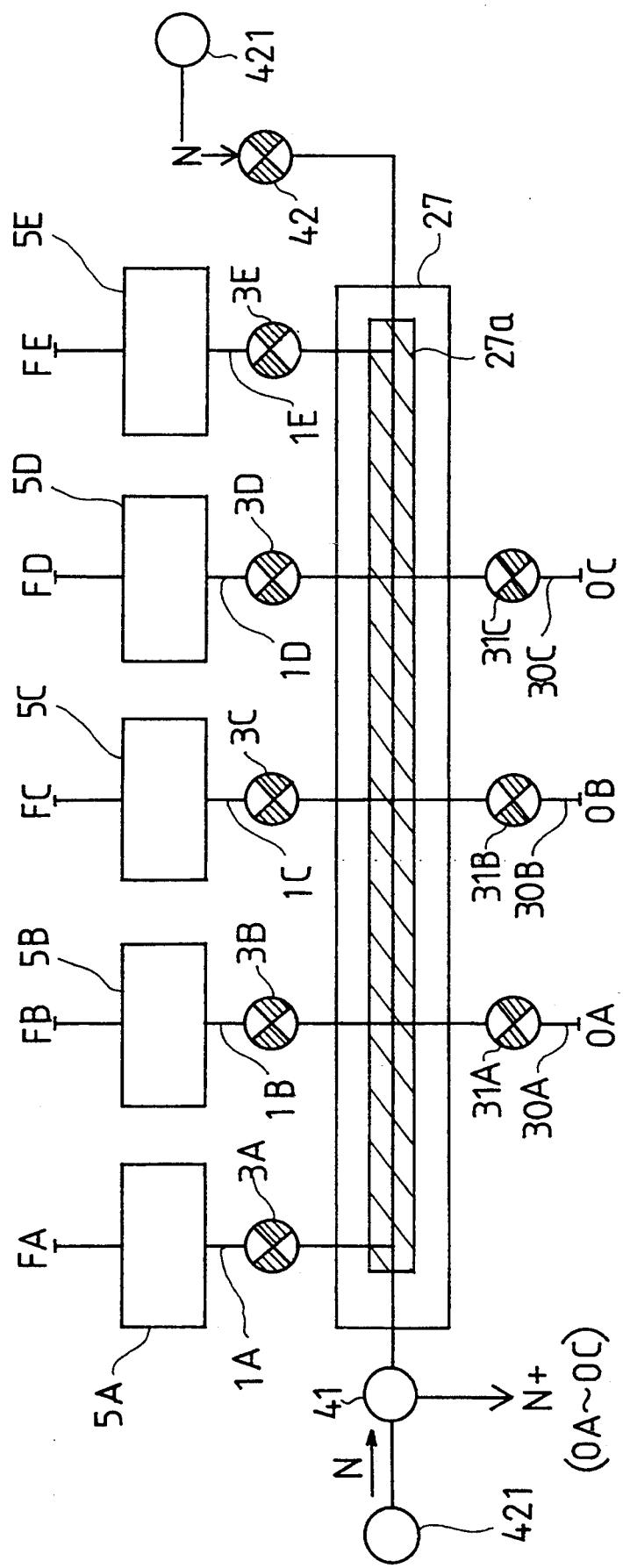
FIG. 2 is a circuit diagram of the gas supplying system.
Figure 3:
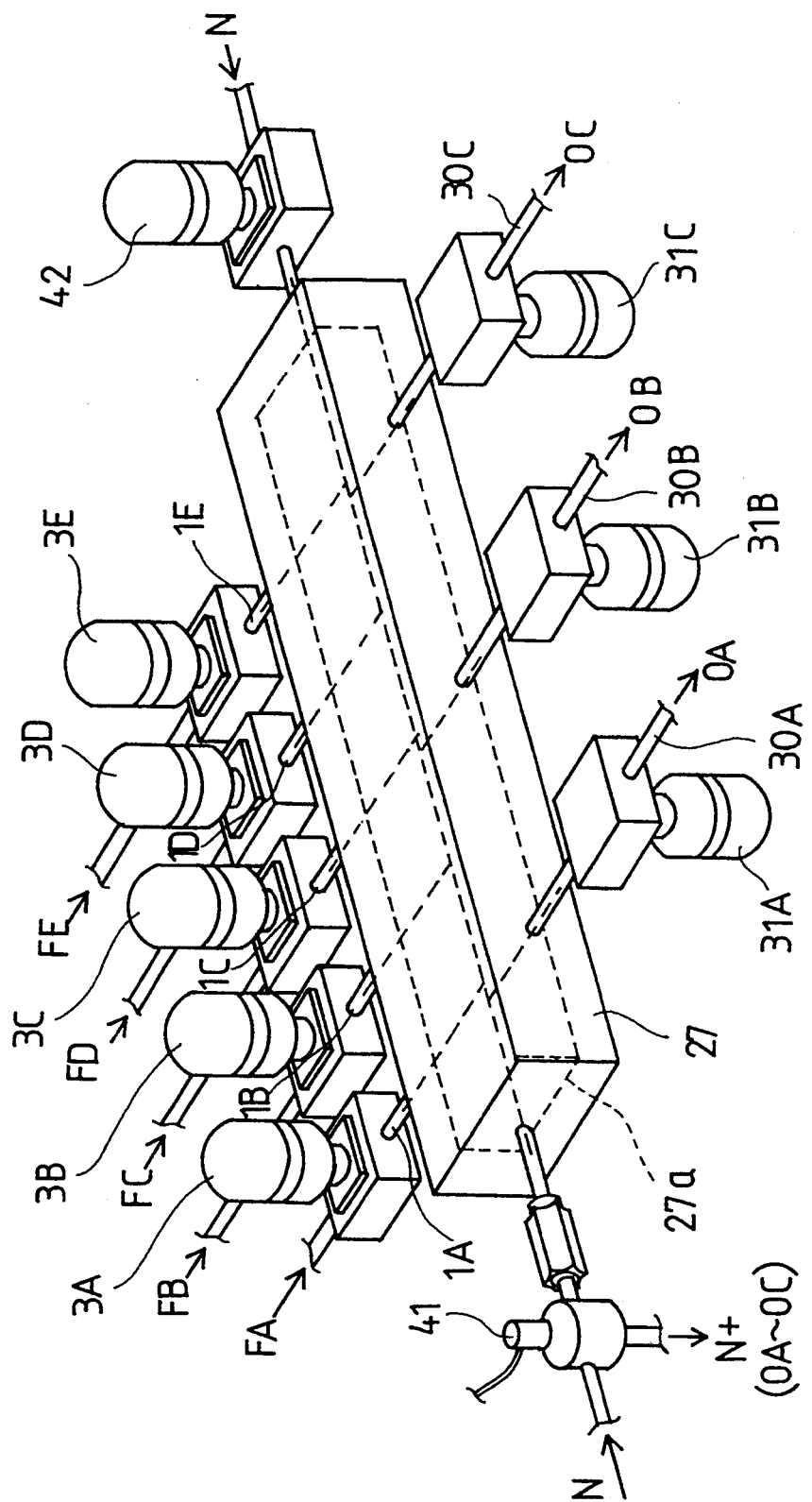
FIG. 3 is a perspective view of an essential part of a gas supplying apparatus applying the gas supplying system.

FIG. 2 shows a circuit diagram illustrating a construction of a gas supplying system in a first preferred embodiment according to the present invention, and FIG. 3 shows in perspective an essential part of a gas supplying apparatus applying the system shown in FIG. 2.

Referring to FIGS. 2 and 3, reference numeral 27 designates a rectangular prismatic chamber having a hollow portion 27a. Five gas input pipes 1A to 1E are connected at their downstream ends to a longitudinal side surface of the chamber 27 so as to be communicated with the hollow portion 27a. The five gas input pipes 1A to 1E serve to respectively introduce five kinds of corrosive gases or component gases (which will be hereinafter generally named stock gases) FA to FE into the chamber 27.

Five input valves 3A to 3E as the first shut-off valves according to the present invention are connected to the five gas input pipes 1A to 1E, respectively, on the upstream side of the chamber 27. Each of the input valves 3A to 3E is formed as an electromagnetic valve.

Three gas output pipes 30A to 30C are connected at their upstream ends to another longitudinal side surface of the chamber 27 so as to be communicated with the hollow portion 27a. The three gas output pipes 30A to 30C serve to distribute a supply gas as a mixture of the stock gases obtained in the hollow portion 27a of the chamber 27 into three parts OA to OC and respectively feed the supply gases OA to OC, to suitable etching devices in a semiconductor manufacturing process.

Three output valves 31A to 31C as the second shut-off valves according to the present invention are connected to the three gas output pipes 30A to 30C, respectively, on the downstream side of the chamber 27. Each of the output valves 31A to 31C is formed as an electromagnetic valve.

An ejector 41 as the evacuating means according to the present invention is connected to a longitudinal end of the chamber 27 so as to be communicated with the hollow portion 27a. The ejector 41 serves to evacuate the chamber 27 to eject a residual part of the supply gas left in the hollow portion 27a of the chamber 27 after feeding the supply gases to the etching devices.

A purge valve 42 as the substitute gas charging means according to the present invention is connected to another longitudinal end of the chamber 27 so as to be communicated with the hollow portion 27a. The purge valve 42 serves to charge an inert gas (e.g., nitrogen gas) N as the substitute gas into the hollow portion 27a of the chamber 27 to thereby purge the residual supply gas in the chamber 27.

An inert gas tank 421 storing the inert gas N is connected to the purge valve 42. The inert gas tank 421 is also connected to the ejector 41.

Five flow control valves 5A to 5E are connected to the gas input pipes 1A to 1E on the upstream side of the input valves 3A to 3E, respectively. The flow control valves 5A to 5E serve to measure mass flows of the stock gases FA to FE and supply predetermined amounts of the stock gases FA to FE to the chamber 27.

A structure of the ejector 41 will now be described with reference to FIG. 9.

Figure 9:
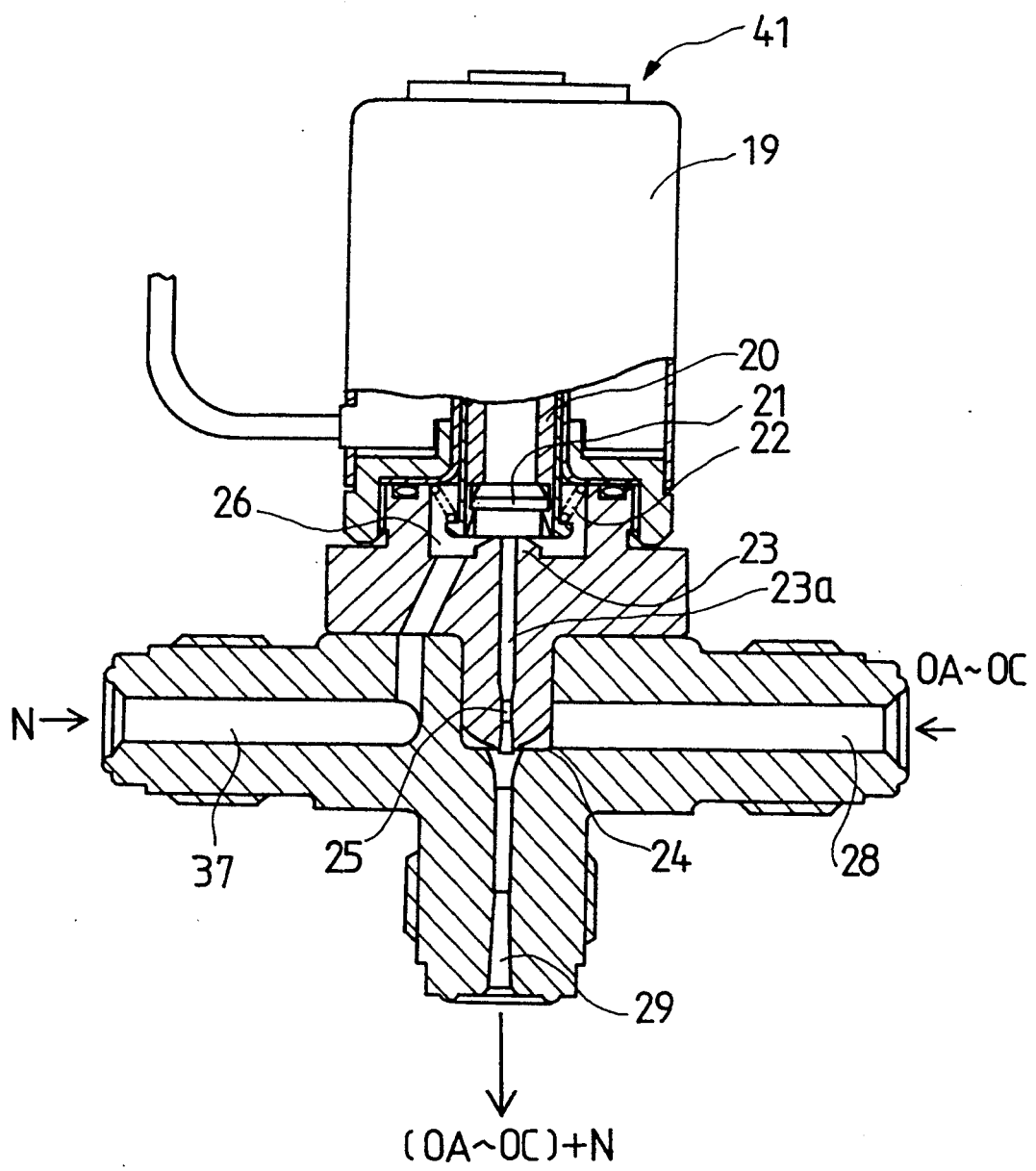
FIG. 9 is a partially sectional side view of an ejector shown in FIG. 3.

Referring to FIG. 9, the ejector 41 has a first input port 28 for receiving a residual supply gas from the chamber 27, a second input port 37 for receiving an operating fluid (e.g., nitrogen gas) from the inert gas tank 421, and an output port 29 for ejecting the residual supply gas with the operating fluid.

The second input port 37 is communicated with a valve chamber 26. The valve chamber 26 is defined at an upper end portion of a valve seat member 23. The valve seat member 23 is formed with a central passage 23a opening at its upper end to the valve chamber 26. The central passage 23a is communicated at its lower end through a nozzle 25 to a pressure reducing portion 24. The pressure reducing portion 24 is communicated with the output port 29. The first input port 28 is communicated with the pressure reducing portion 24.

A valve element 21 is seated on the valve seat member 23 at the upper end of the central passage 23a. The valve element 21 is fixedly engaged with an armature 20 at a lower end thereof. The armature 20 is normally biased by a return spring 22 to normally seat the valve element 21 on the valve seat member 23. The armature 20 is vertically movably engaged in a hollow portion of a coil 19.

The ejector 41 having the above structure operates as follows:

When the coil 19 is excited, the armature 20 is moved upwardly by a stator core (not shown). As a result, the valve element 21 is separated from the valve seat member 23.

Accordingly, the inert gas N as the operating fluid is introduced from the second input port 37 through the valve chamber 26 and the central passage 23a of the valve seat member 23 to the nozzle 25. A flow velocity of the inert gas N at the nozzle 25 is increased to thereby generate a vacuum at the pressure reducing portion 24. Thus, the inert gas N is discharged at a high velocity from the pressure reducing portion 24.

At the same time, the residual supply gas remaining in the chamber 27 is sucked from the first input port 28 by the vacuum generated at the pressure reducing portion 24, and is mixed with the inert gas N injected from the nozzle 25 owing to a viscosity between the inert gas N and the residual supply gas. Then, the mixture gas is discharged from the output port 29. The mixture gas thus discharged is recovered through a recovery pipe (not shown) to a recovery tank (not shown).

Since a concentration of the residual supply gas is reduced by the inert gas N before discharged from the output port 29, corrosion of the inner wall surfaces of the recovery pipe and the recovery tank by the residual supply gas, e.g., a corrosive gas can be suppressed.

A control device of the gas supplying apparatus in the first preferred embodiment will now be described with reference to FIG. 4.

Figure 4:
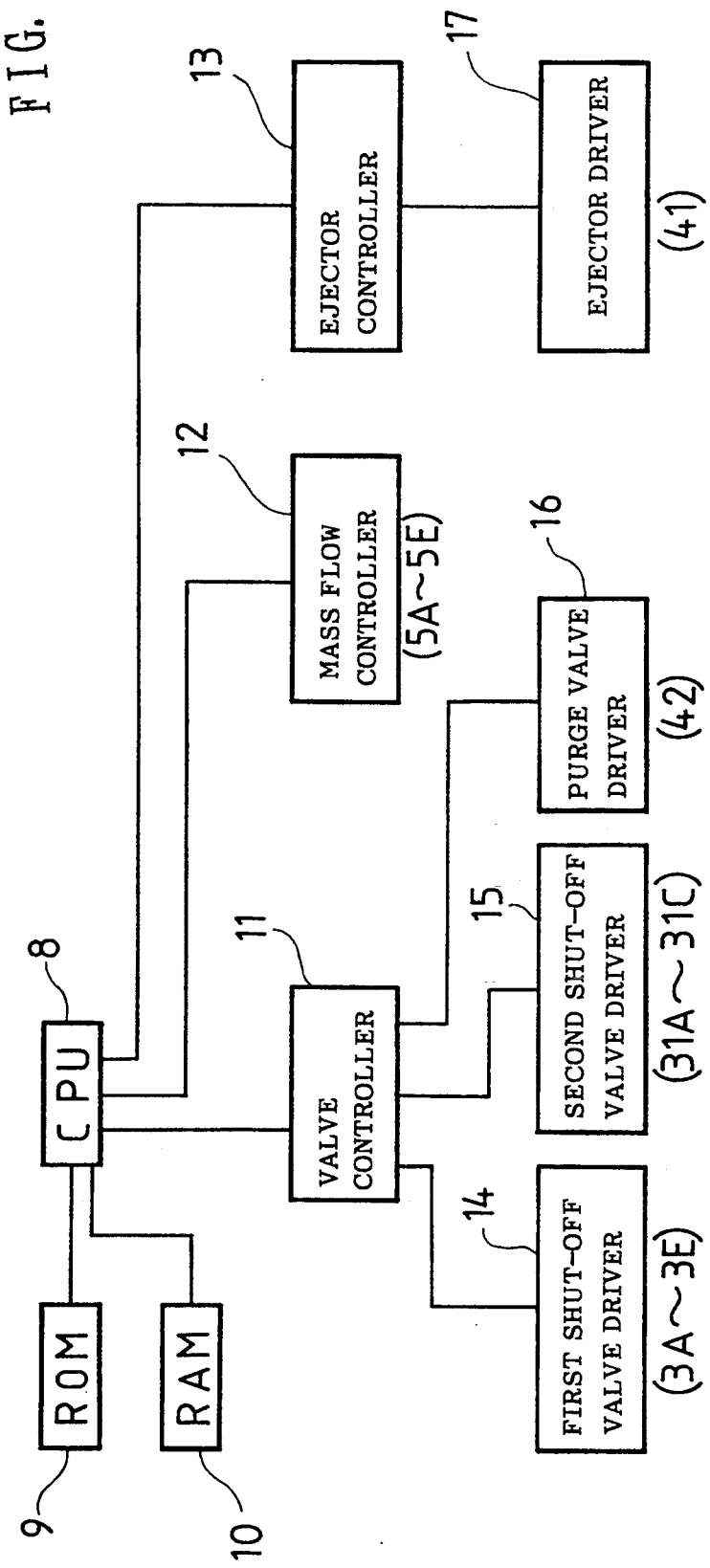
FIG. 4 is a block diagram of a control device in the gas supplying apparatus.

Referring to FIG. 4, the control device includes a CPU 8 for generally controlling the gas supplying apparatus, a ROM 9 preliminarily storing a control program for the gas supplying apparatus, and a RAM 10 for temporarily storing data or the like upon computation by the CPU 8 or storing external data input. The ROM 9 and the RAM 10 are connected to the CPU 8.

Further, a valve controller 11, a mass flow controller 12 and an ejector controller 13 are connected to the CPU 8.

Connected to the valve member 11 are a first shut-off valve driver 14 for driving the input valves 3A to 3E as the first shut-off valves, a second shut-off valve driver 15 for driving the output valves 31A to 31C as the second shut-off valves, and a purge valve driver 16 for driving the purge valve 42.

The flow control valves 5A to 5E are connected to the mass flow controller 12.

An ejector driver 17 for driving the ejector 41 is connected to the ejector controller 13.

Now, the operation of the gas supplying system mentioned above will be described with reference to FIG. 1.

In step 1, the CPU 8 receives a command from a computer (not shown) for generally controlling the semiconductor manufacturing process to select one or more of the stock gases FA to FE. Then, one or more of the input valves 3A to 3E corresponding to the selected stock gases are opened by the first shut-off valve driver 14.

The mass flows of the selected stock gases flowing in the corresponding gas input pipes are measured by the corresponding flow control valves, and are controlled to become predetermined amounts by the mass flow controller 12. Thus, under the control by the mass flow controller 12, the selected stock gases are supplied to the hollow portion 27a of the chamber 27.

At this time, one or more of the output valves 31A to 31C so selected as to feed the supply gas to target etching devices in the semiconductor manufacturing process are opened by the second shut-off valve driver 15, and the other output valves remain closed.

Since the stock gases flowing into the hollow portion 27a of the chamber 27 has a considerably high velocity, they are sufficiently mixed with each other without any special mixing device, and the mixture of the stock gases as the supply gas in a predetermined amount is fed through the open output valves to the target etching devices.

Of course, a suitable mixing device such as a fixed type axial-flow impeller for forcibly mixing the stock gases flowing into the hollow portion 27a of the chamber 27 may be provided to effect the mixing more quickly and more uniformly.

In step 2, when the predetermined amounts of the stock gases are measured by the mass flow controller 12, the open input valves are closed by the first shut-off valve driver 14. The above predetermined amounts are experimentally defined in consideration of a residual amount of the supply gas to finally remain in the chamber 27.

After a short period of time from a timing of closing of the open input valves, the open output valves are closed by the second shut-off valve driver 15. As a result, the supply gas remains in the hollow portion 27a of the chamber 27.

In step 3, the ejector 41 is excited by the ejector driver 17 to evacuate the hollow portion 27a of the chamber 27. That is, when the ejector 41 is excited, the inert gas N as the operating fluid is introduced into the ejector 41 to suck the residual supply gas from the chamber 27 into the ejector 41. Then, the mixture of the inert gas N and the residual supply gas is ejected.

The reason why the inert gas N is used as the operating fluid is that the piping for charging the inert gas N as the substitute gas into the chamber 27 is located in the vicinity of the chamber 27, and accordingly the need of providing any additional piping for feeding the operating fluid can be eliminated by utilizing the piping for charging the inert gas N.

In step 4, after the operation of the ejector 41 is stopped, the purge valve 42 is opened by the purge valve driver 16 to charge the inert gas N into the hollow portion 27a of the chamber 27.

In step 5, the operations of the step 3 and the step 4 are repeated several times. The number of repetitions is specified by the CPU 8 according to the kind of the residual supply gas and the kinds of stock gases to be next supplied.

In modification, the number of repetitions or the total operation periods may be specified according to input data from an operator with an IC card or the like.

Owing to the repetitions of the evacuation by the ejector 41 and the charging of the inert gas N by the purge valve 42, the residual supply gas sticking to an inner wall surface of the chamber 27 can be blown off by the inert gas N and sucked by the ejector 41, thereby efficiently removing the residual supply gas from the chamber 27.

FIGS. 5 to 8 show a rate of decrease in concentration of the residual supply gas in the chamber 27 with respect to an elapsed time in various cases.

Figure 5:
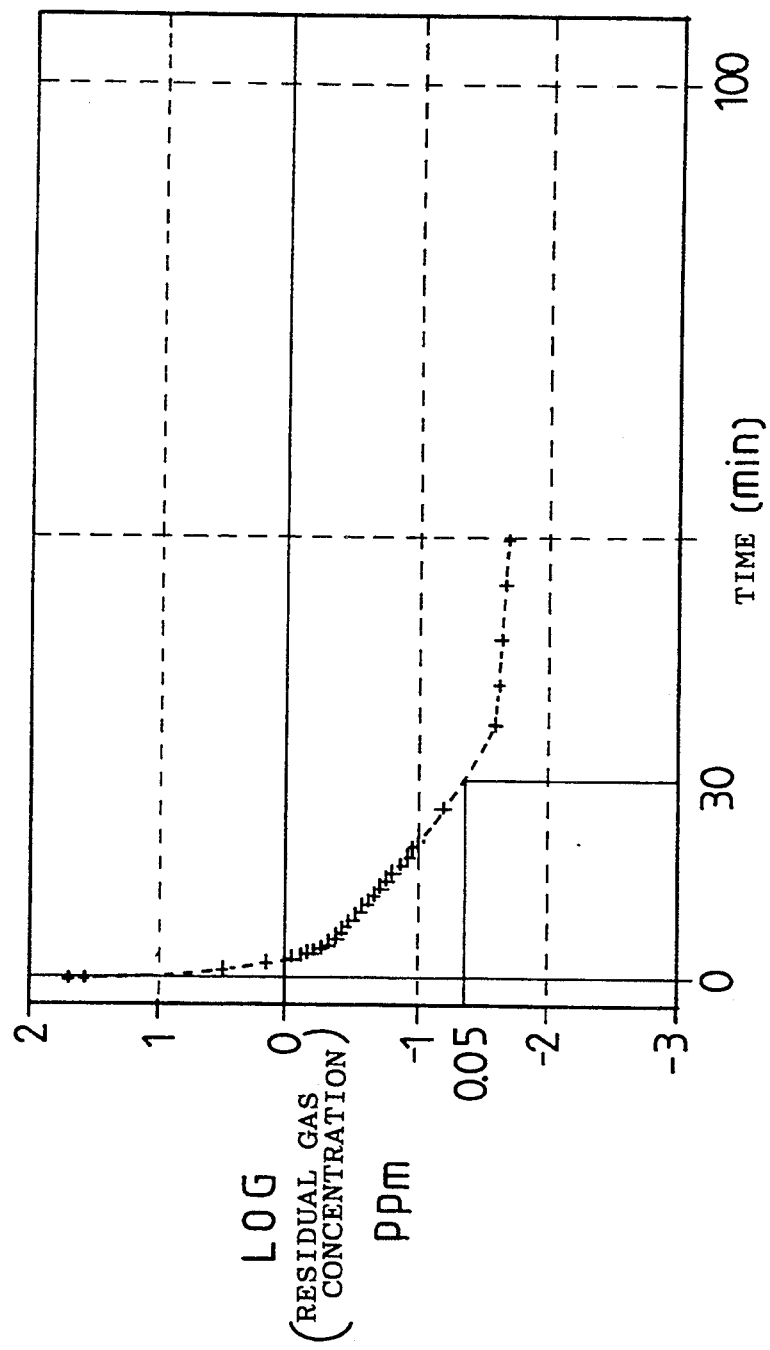
FIG. 5 is a graph showing a first test result obtained by a gas supplying system in the prior art.

In the case shown in FIG. 5 where the evacuation by the ejector 41 was not carried out and the purging by the inert gas N was once carried out for one minute, the result shows that the concentration of the residual supply gas after one minute is still 10 ppm or more and that a period for reaching an allowable background value of 0.05 ppm is about 30 minutes.

Figure 6:
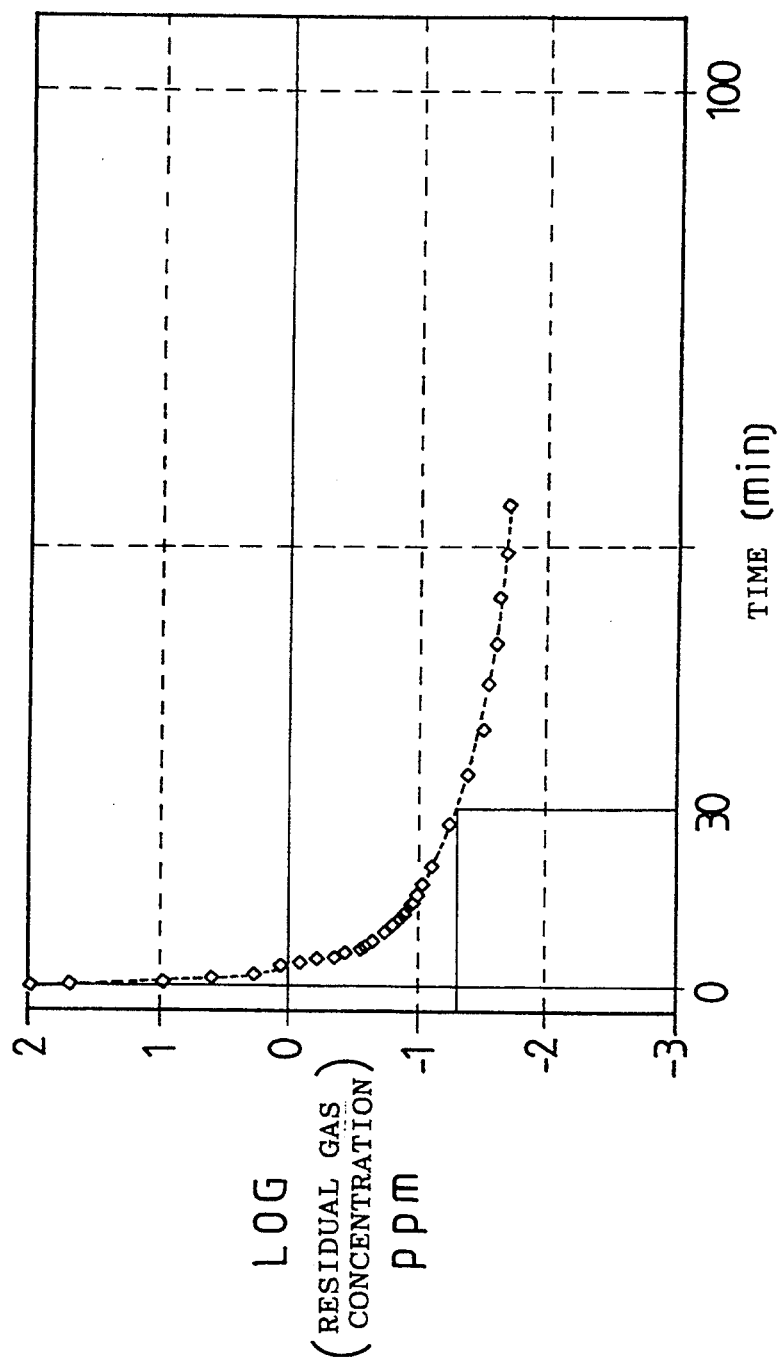
FIG. 6 is a graph showing a second test result obtained by the gas supplying system in the prior art.

In the case shown in FIG. 6 where the evacuation by the ejector 41 was once carried out for two seconds and then the purging by the inert gas N was once carried out for eight seconds, the result shows that the concentration of the residual supply gas after one minute is still 10 ppm or more and that a period of reaching the background value of 0.05 ppm is about 30 minutes. That is, the result in this case is substantially the same as the result shown in FIG. 5.

Figure 7:
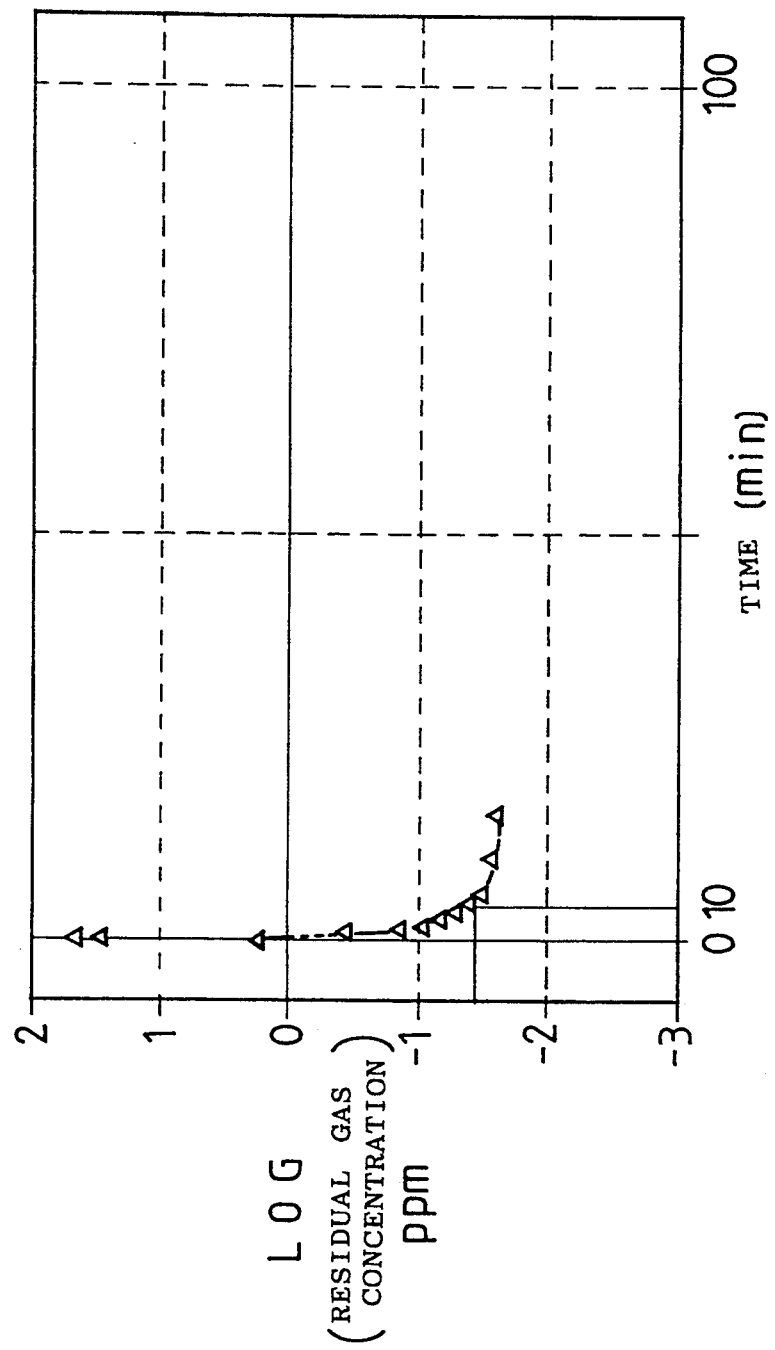
FIG. 7 is a graph showing a first test result obtained by the gas supplying system in the first preferred embodiment.

In the case shown in FIG. 7 where the evacuation by the ejector 41 for two seconds and the purging by the inert gas N for eight seconds were alternately carried out five times, the result shows that the concentration of the residual supply gas after one minute is about 0.1 ppm or less and that a period for reaching the background value of 0.05 ppm is about 10 minutes. That is, the result in this case approves that the repetitions of the evacuation and the purging in the first preferred embodiment is effective for acceleration of a decrease in concentration of the residual supply gas and acceleration of reaching of the background value.

Figure 8:
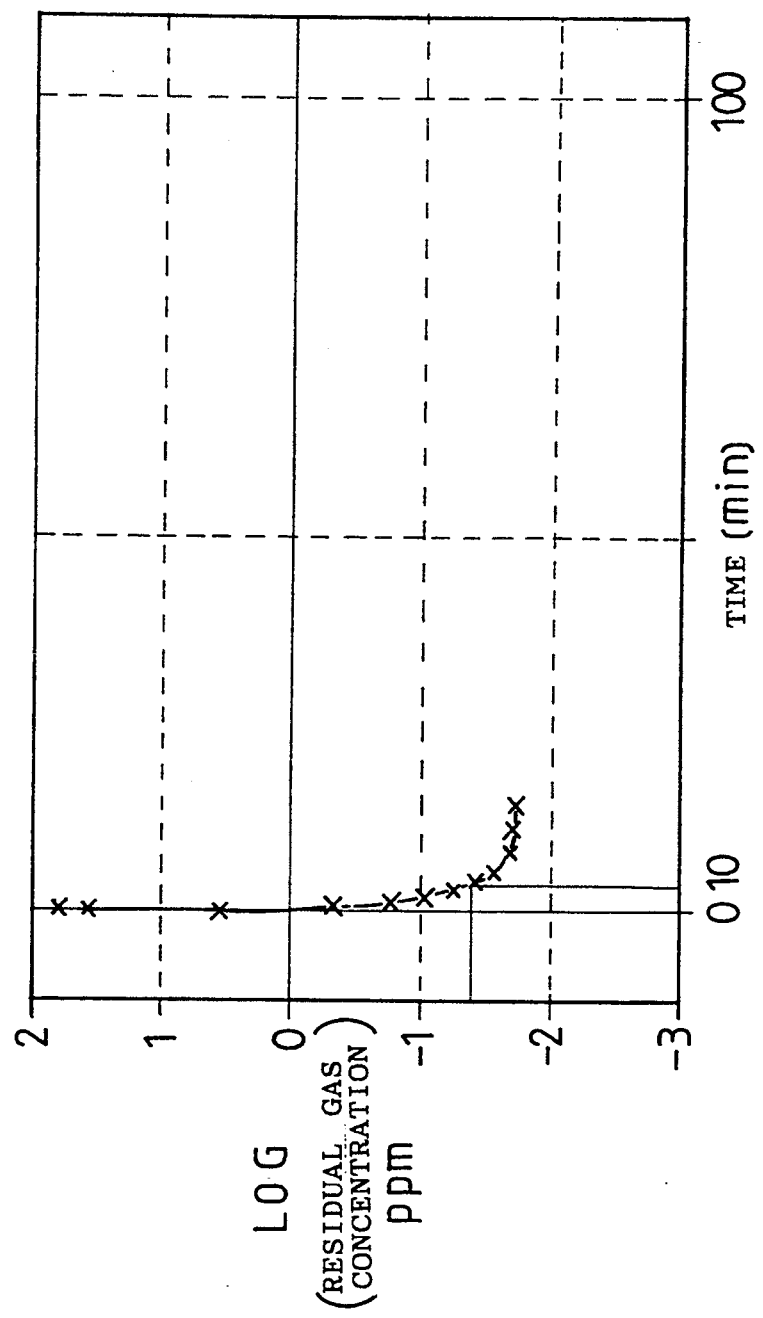
FIG. 8 is a graph showing a second test result obtained by the gas supplying system in the first preferred embodiment.

In the case shown in FIG. 8 where the evacuation by the ejector 41 for two seconds and the purging by the inert gas N for eight seconds were alternately carried out ten times, the result shows that the concentration of the residual supply gas after one minute is about 0.1 ppm or less and that a period for reaching the background value of 0.05 ppm is about 10 minutes. That is, the result in this case where the number of repetitions is ten is substantially the same as the result in the case shown in FIG. 7 where the number of repetitions is five.

Consequently, the repetitions of the evacuation by the ejector 41 and the purging by the inert gas N gives a good effect that the residual supply gas can be removed efficiently in a short time, thereby improving the efficiency of the semiconductor manufacturing process.

Although the evacuation by the ejector 41 and the purging by the inert gas N are alternately carried out in this preferred embodiment, the evacuation and the purging may be simultaneously carried out.

If a vacuum pump is used to first evacuate the chamber 27, the inner wall surface of the recovery pipe will be subject to the residual supply gas having a high concentration to cause corrosion of the recovery pipe. However, in this preferred embodiment, the concentration of the residual supply gas is reduced by the inert gas N as the operating fluid employed in the ejector 41, and the residual supply gas having a low concentration is fed through the recovery pipe, thereby suppressing the corrosion of the recovery pipe. Accordingly, the evacuation by the ejector 41 can be first carried out.

The inert gas N such as a nitrogen gas may be used as one of the stock gases FA to FE. In this case, the concentration of the supply gas to be supplied to the semiconductor manufacturing process can be reduced to a desired concentration.

In this preferred embodiment, a plurality of kinds of stock gases FA to FE are supplied through a plurality of gas input pipes 1A to 1E to the chamber 27, and the mixture of the stock gases obtained as the supply gas in the chamber 27 is then separately supplied through a plurality of gas output pipes 30A to 30C to the respective etching devices in the semiconductor manufacturing process. In modification, the gas output pipes 30A to 30C in the above preferred embodiment may be replaced by a single gas output pipe to be led to a single etching device. In this case, the output valves 31A to 31C in the above preferred embodiment are, of course, replaced by a single output valve.

Further, the gas input pipes 1A to 1E in the above preferred embodiment may be replaced by a single gas input pipe for supplying a single kind of stock gas to the chamber 27. In this case, the input valves 3A to 3E in the above preferred embodiment are, of course, replaced by a single input valve. Further, in this case, the function of the chamber 27 is not to mix the plural kinds of stock gases but to merely distribute the supplied stock gases into the gas output pipes 30A to 30C.

A second preferred embodiment according to the present invention will now be described with reference to FIGS. 10 to 14.

Figure 10:
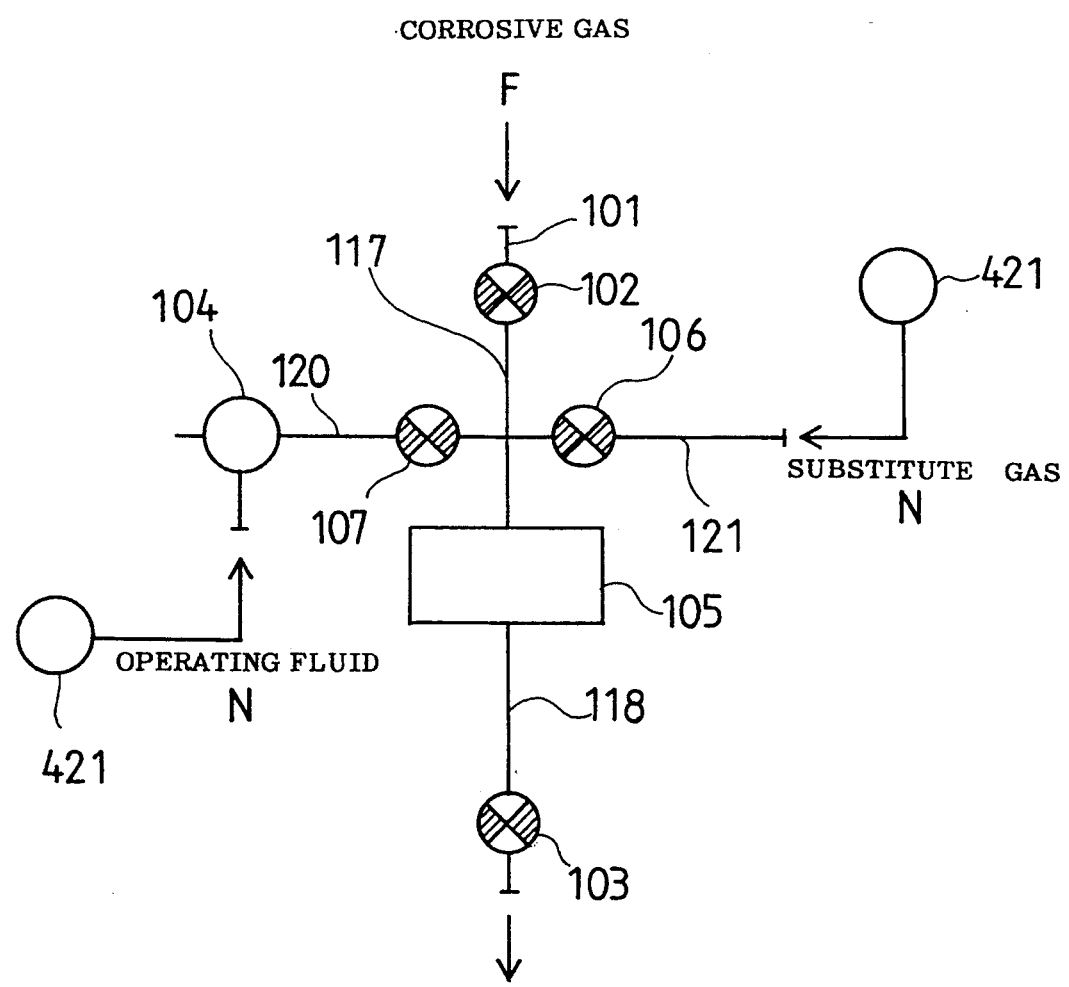
FIG. 10 is a circuit diagram of a gas supplying system in a second preferred embodiment according to the present invention.

Referring to FIG. 10 which shows a circuit diagram of a gas supplying apparatus in the second preferred embodiment, an input valve 102 as the first shut-off valve is connected to a gas supply pipe 101 for supplying a corrosive gas F. A flow control valve 105 for measuring a mass flow of the corrosive gas F and controlling the same to a predetermined value is connected to the gas supply pipe 101 on the downstream side of the input valve 102. Further, an output valve 103 as the second shut-off valve is connected to the gas supply pipe 101 on the downstream side of the flow control valve 105.

An ejector valve 107 and a purge valve 106 are connected to a passage 117 between the input valve 102 and the output valve 103. An ejector 104 as the evacuating means is connected to the ejector valve 107. An inert gas tank 421 storing an inert gas N as the operating fluid for the ejector 104 is connected to the ejector 104. The inert gas tank 421 storing the inert gas N as the substitute gas to be charged into the gas supply pipe 101 is also connected to the purge valve 106.

Referring to FIGS. 11A to 11C and 12 which show a structure of the gas supplying apparatus shown in FIG. 10, an input joint 108 is connected to one end of a gas input pipe 101A constituting the gas supply pipe 101. The other end of the gas input pipe 101A is connected to a left end surface of an input block 113 as viewed in FIG. 11C.

A left end surface of the flow control valve 105 is connected to a right end surface of the input block 113 as viewed in FIG. 11C. A left end surface of an output block 114 is connected to a right end surface of the flow control valve 105 as viewed in FIG. 11C. The input valve 102 is connected to an upper end surface of the input block 113, and the output valve 103 is connected to an upper end surface of the output block 114. Further, one end of a gas output pipe 101B constituting the gas supply pipe 101 is connected to a right end surface of the output block 114, and an output joint 109 is connected to the other end of the gas output pipe 101B.

A base block 112 is connected to a lower end surface of the input block 113. The input block 113 and the base block 112 integrated together constitute the chamber according to the present invention.

The ejector 104 is connected through an ejector joint 111 to one end of the base block 112. The inert gas tank 421 is connected through an inert gas input joint 110 to the other end of the base block 112.

The ejector valve 107 and the purge valve 106 are connected to the right end surface of the input block 113.

The flow of the corrosive gas F and the inert gas N will now be described in more detail.

The corrosive gas F is supplied from a supply gas tank (not shown) through the input joint 108 into the gas input pipe 101A. An output end of the gas input pipe 101A is communicated through a first passage 115 formed in the input block 113 to an input port of the input valve 102. An output port of the input valve 102 is communicated through a second passage 117 formed in the input block 113 to an input port of the flow control valve 105, an input port of the ejector valve 107 and an output port of the purge valve 106.

An output port of the flow control valve 105 is communicated through a first passage 118 formed in the output block 114 to an input port of the output valve 103. An output port of the output valve 103 is communicated through a second passage 119 formed in the output block 114 to the gas output pipe 101B. Thus, the corrosive gas F is discharged from the gas output pipe 101B through the output joint 109 to an etching device in a semiconductor manufacturing process.

On the other hand, an output port of the ejector valve 107 is communicated through a first passage 120 formed in the base block 112 and through the ejector joint 111 to the ejector 104.

An input port of the purge valve 106 is communicated through a second passage 121 formed in the base block 112 and through the inert gas input joint 110 to the inert gas tank 421. The ejector 104 is also communicated to the inert gas tank 421.

A structure of the flow control valve 105 will now be described with reference to FIG. 13.

The flow control valve 105 serves to precisely measure a mass flow of the corrosive gas F and control the same to a predetermined value.

Figure 13:
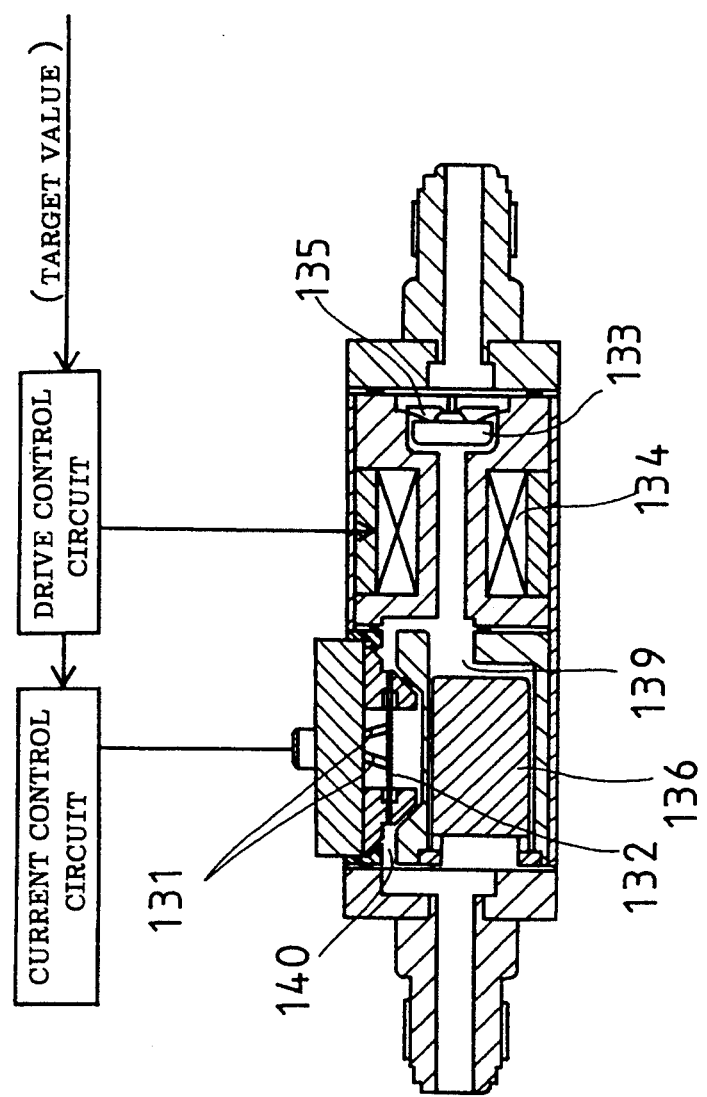
FIG. 13 is a sectional view of a flow control valve shown in FIG. 12.

Referring to FIG. 13, the flow control valve 105 is formed with a main passage 139 and a branch passage 140. A conduit tube 132 is provided in the branch passage 140, so as to measure a mass flow of the corrosive gas F. A restriction member 136 is provided in the main passage 139, so as to deflect a part of the corrosive gas F into the branch passage 140.

The flow control valve 105 is provided with a mass flow sensor capable of measuring a mass flow with a high accuracy and a high responsiveness. That is, a pair of self-heating temperature sensing elements each having a large temperature coefficient are wound around the thin conduit tube 132 at its upstream and downstream ends to form a pair of heat sensitive coils 131. A bridge circuit is formed by each heat sensitive coil 131, and a temperature of each heat sensitive coil 131 is controlled to a constant value by a current control circuit 137. A mass flow of the corrosive gas F flowing in the conduit tube 132 is computed from a potential difference between both the bridge circuits. On the basis of the result of computation, excitation of a coil 134 is changed by a drive control circuit 138 to drive an armature 133 and a valve element 135 fixed to the armature 133, thus controlling the mass flow.

The conduit tube 132 is formed as a tube having an inner diameter of 0.5 mm and a length of 20 mm, which is made of SUS 316, for example. The small inner diameter is intended to measure a small amount of flowing gas.

Each heat sensitive coil 131 is formed by winding 70 turns of heat sensitive resistance wire having a diameter of 25 μm around the conduit tube 132. The heat sensitive resistance wire is made of a material having a large temperature coefficient, such as iron or nickel alloy. Each heat sensitive coil 131 is bonded to the conduit tube 132 by UV curing resin or the like to form a sensing element.

The operation of the gas supplying apparatus in the second preferred embodiment will now be described.

The corrosive gas F supplied from the corrosive gas tank through the input joint 108 to the gas input pipe 101A is allowed to flow through the first passage 115 in the input block 113 to the input port of the input valve 102.

When the input valve 102 is opened, the input port and the output port of the input valve 102 come into communication with each other. The corrosive gas F discharged from the output port of the input valve 102 is allowed to flow through the second passage 117 in the input block 113 into the input port of the flow control valve 105.

The corrosive gas F introduced into the flow control valve 105 is divided to flow into the main passage 139 and the branch passage 140. The corrosive gas F flowing into the branch passage 140 is introduced into the conduit tube 132, and is heated by the heat sensitive coils 131 wound around the conduit tube 132 at its upstream and downstream ends.

In the flow control valve 105, a temperature of the heat sensitive coils 131 is controlled to a constant value by the current control circuit 137, and a mass flow of the corrosive gas F is computed from a potential difference between the bridge circuits formed of the heat sensitive coils 131. Then, on the basis of the result of computation, the excitation of the coil 134 is changed by the drive control circuit 138 to drive the armature 133 and the valve element 135 and control the mass flow.

The corrosive gas F discharged from the output port of the flow control valve 105 is allowed to flow through the first passage 118 in the output block 114 into the input port of the output valve 103. As the output valve 103 is in an open condition, the input port and the output port of the output valve 103 are in communication with each other.

The corrosive gas F discharged from the output port of the output valve 103 is allowed to flow through the second passage 119 in the output block 114 and through the gas output pipe 101B to the output joint 109. Then, the corrosive gas F is supplied to the etching device in the semiconductor manufacturing process.

When a predetermined amount of the corrosive gas F measured by the flow control valve 105 is supplied to the etching device, both the input valve 102 and the output valve 103 are closed. At this time, the corrosive gas F remains in the passages in the input block 113, the flow control valve 105 and the output block 114, and also remains in the conduit tube 132 in the flow control valve 105.

Thereafter, the purge valve 106 is opened to allow the inert gas N to flow into the above passages. Then, the purge valve 106 is closed, and the ejector valve 107 is opened. Simultaneously, the ejector 104 is excited to suck the residual corrosive gas F with the inert gas N previously charged into the passages.

That is, when the ejector valve 107 is opened and the ejector 104 is excited, the inert gas N as the operating fluid is introduced into the ejector 104. As a result, the residual corrosive gas F and the charged inert gas N are sucked under a reduced pressure by the ejector 104, and the mixture of the residual corrosive gas F, the charged inert gas N as the substitute gas and the inert gas N as the operating fluid is discharged from the ejector 104.

It is preferable that the above operations of the charging of the inert gas N and the evacuation by the ejector 104 are alternately carried out several times. Owing to the repetitions of the charging and the evacuation, the residual corrosive gas F sticking to an inner wall surface of the conduit tube 132 in the flow control valve 105 in particular can be blown off by the inert gas N and sucked by the ejector 104, thereby efficiently removing the residual corrosive gas F from the passages.

Figure 14:
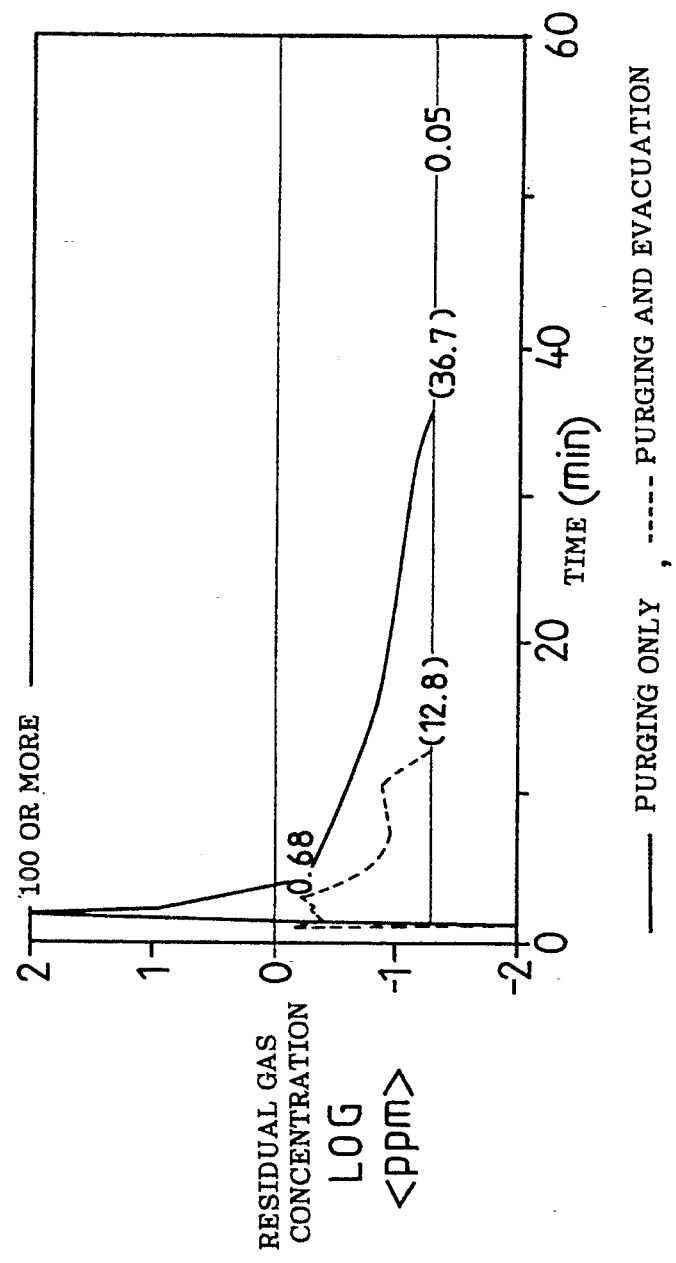
FIG. 14 is a graph showing a test result obtained by the gas supplying system in the second preferred embodiment in comparison with that obtained by a gas supplying system in the prior art.

FIG. 14 shows a rate of decrease in concentration of the residual corrosive gas F in the passages with respect to an elapsed time in different cases.

In the case shown by a solid line in FIG. 14 where the evacuation by the ejector 104 was not carried out and the purging by the inert gas N was once carried out, the result shows that the concentration of the residual corrosive gas F after one minute is still 100 ppm or more and that a period for reaching a permissible background value of 0.05 ppm is 36.7 minutes.

In the case shown by a dashed line in FIG. 14 in this preferred embodiment where the charging of the inert gas N for eight seconds and the evacuation by the ejector 104 for two seconds were alternately carried out six times, the result shows that the concentration of the residual corrosive gas F after one minute is 0.68 ppm and that a period for reaching the background value of 0.05 ppm is 12.8 minutes.

Thus, the result shown by the dashed line in the second preferred embodiment approves that the repetitions of the charging and the evacuation is effective for acceleration of a decrease in concentration of the residual corrosive gas and acceleration of reaching of the background value.

As apparent from the above description, the ejector 104 is located in the vicinity of the passages, and the purging by the inert gas N and the evacuation by the ejector 104 are alternately carried out several times. Therefore, the residual corrosive gas can be removed efficiently in a short time, thereby improving the efficiency of the semiconductor manufacturing process.

Although the purging by the inert gas N and the evacuation by the ejector 104 are alternately carried out in this preferred embodiment, the purging and the evacuation may be simultaneously carried out.

If a vacuum pump is used to first evacuate the passages, the inner wall surface of the recovery pipe will be subject to the residual corrosive gas F having a high concentration to cause corrosion of the recovery pipe. However, in this preferred embodiment, the concentration of the residual corrosive gas F is reduced by the inert gas N as the operating fluid employed in the ejector 104, and the residual corrosive gas F having a low concentration is fed through the recovery pipe, thereby suppressing the corrosion of the recovery pipe. Accordingly, the evacuation by the ejector 104 can be first carried out.

Figure 12:
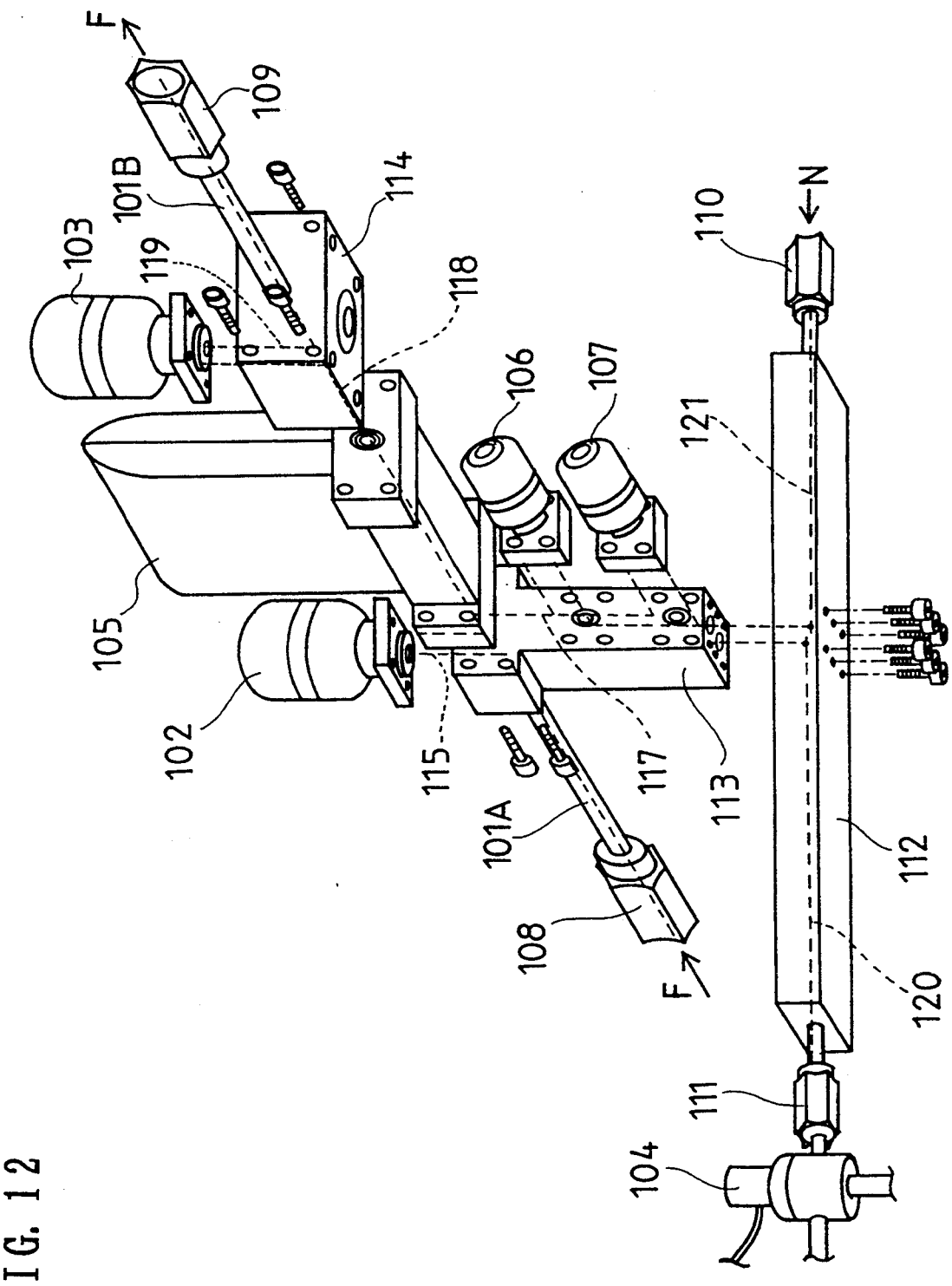
FIG. 12 is an exploded perspective view of the gas supplying apparatus shown in FIGS. 11A to 11C.
Figure 15:
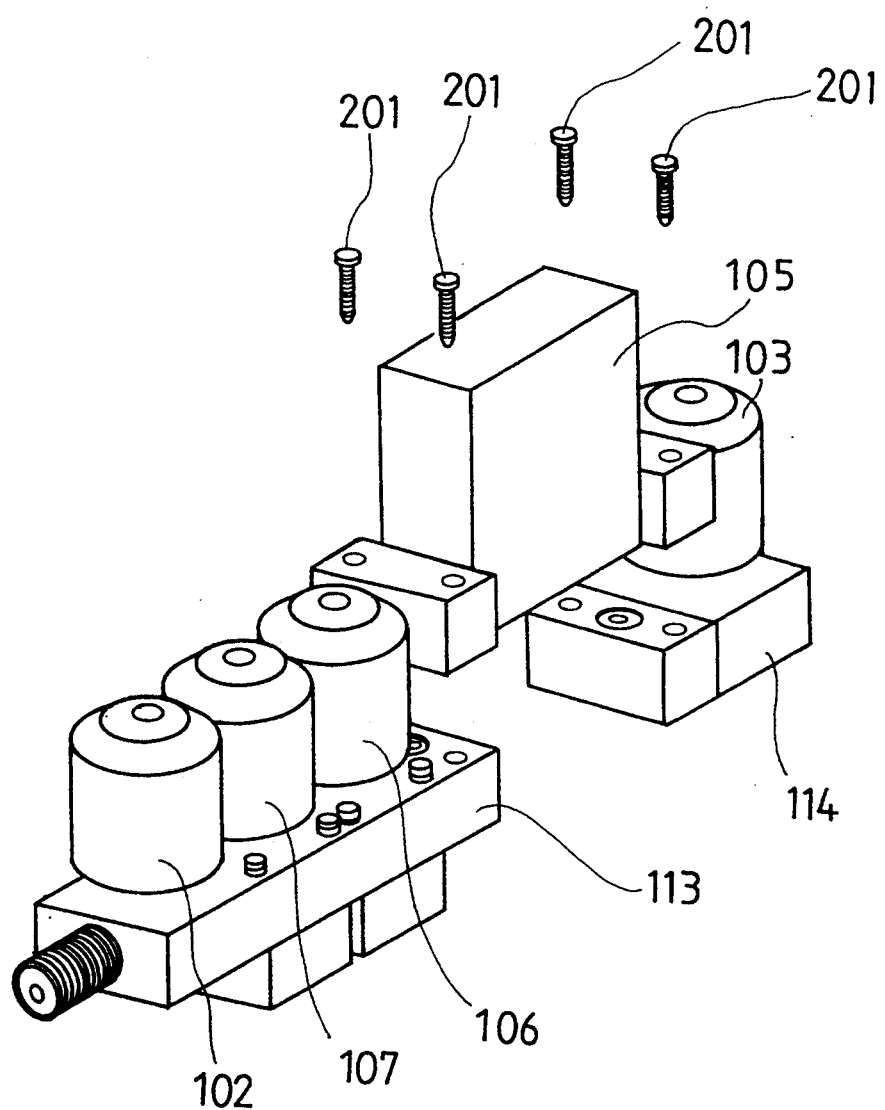
FIG. 15 is an exploded perspective view of a gas supplying apparatus in a third preferred embodiment according to the present invention.

A third preferred embodiment of the gas supplying apparatus will now be described with reference to FIGS. 15 and 16, in which the same reference numerals as those shown in FIG. 12 designate the same parts, and so the detailed explanation thereof will be omitted herein.

The construction of the third preferred embodiment is substantially the same as that of the second preferred embodiment except that a lower end surface of a flow control valve 105 is mounted on an upper end surface of an input block 113 and an upper end surface of an output block 114 by means of upwardly removable mounting bolts 201.

With this construction, even when a thin conduit tube in the flow control valve 105 is choked to cause a trouble and accordingly require the replacement of the flow control valve 105, the flow control valve 105 only can be easily demounted without demounting the other parts. Accordingly, the operation can be quickly restarted.

Figure 16:
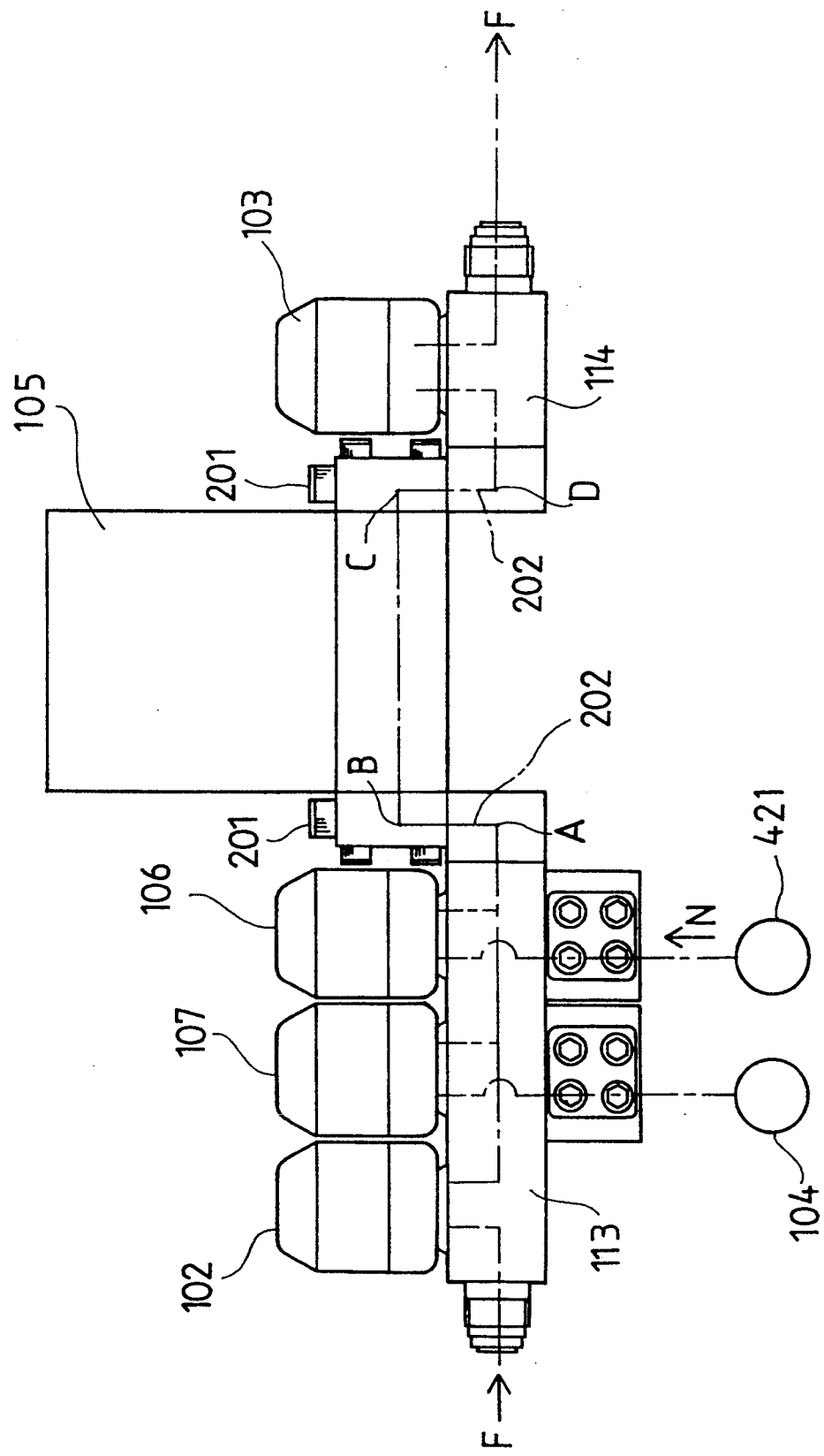
FIG. 16 is a side view of the gas supplying apparatus shown in FIG. 15.

As shown in FIG. 16, a passage 202 formed in the flow control valve 105, the input block 113 and the output block 114 is obliged to be bent at four points A, B, C and D because of the above construction. If a vacuum pump is used to suck a residual corrosive gas F as in the prior art, the bending of the passage 202 at the four points A to D causes an increase in flow resistance in sucking the residual corrosive gas F to leave the residual corrosive gas F in the passage 202. However, in this preferred embodiment, an ejector 104 is located in the vicinity of the passage 202, so that the removal of the residual corrosive gas F can be reliably effected.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments chosen and described in order to explain the principles of the invention and its practical application to enable one skilled in the art to utilize the invention in various embodiments and with various modifications are suited to the particular use contemplated. It is intended that the scope of the invention be defined by the claims appended thereto and their equivalents.

What is claimed is:

1. A gas supplying apparatus, comprising:
   a chamber including opposite endwalls and having an inlet and an outlet for controlling a mass flow of gas from the inlet to the outlet;
   at least one input valve connected to the inlet of the chamber, said at least one input valve operable when open to permit stock gas flow to the chamber and operable when closed to shut off stock gas flow;
   at least one output valve connected to the outlet of the chamber, said at least one output valve operable when open to permit supply gas flow and operable when closed to shut off supply gas flow;
   an ejector connected to the one of the opposite endwalls and in communication with the chamber and the at least one input valve, said ejector operable when activated by an operating gas to evacuate the chamber of supply gas and substitute gas;
   a purge valve connected to the other of the opposite endwalls and in communication with the chamber and the at least one input valve, said purge valve operable when open to introduce substitute gas into the chamber and operable when closed to stop the flow of substitute gas into the chamber;
   a central processing unit; and
   means including an ejector controller and a valve controller responsive to commands from the central processing unit for opening and closing alternately the ejector and purge valve to repetitively evacuate and introduce substitute gas into said chamber a number of times determined by the residual gas in said chamber and the stock gases next to be supplied to said chamber.

2. The gas supplying apparatus of claim 1, wherein said at least one input valve comprises a plurality of input valves connected to said chamber intermediate said opposite endwalls, said chamber for mixing stock gases.

3. The gas supplying apparatus of claim 1, wherein said at least one output valve comprises a plurality of output valves connected to said chamber intermediate said opposite endwalls.

* * * * *